(12) United States Patent
Yang et al.

(10) Patent No.: US 10,529,284 B2
(45) Date of Patent: Jan. 7, 2020

(54) PIXEL AND ORGANIC LIGHT EMITTING DISPLAY DEVICE USING THE SAME

(71) Applicant: Samsung Display Co., Ltd., Yongin-si (KR)

(72) Inventors: Gun Woo Yang, Yongin-si (KR); Gi Chang Lee, Yongin-si (KR); Won Jun Lee, Yongin-si (KR); Won Gyun Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 82 days.

(21) Appl. No.: 15/851,618

(22) Filed: Dec. 21, 2017

(65) Prior Publication Data

US 2018/0197475 A1 Jul. 12, 2018

(30) Foreign Application Priority Data

Jan. 9, 2017 (KR) .......................... 10-2017-0002883

(51) Int. Cl.
*G09G 3/3233* (2016.01)
*G09G 3/3266* (2016.01)
(Continued)

(52) U.S. Cl.
CPC ......... *G09G 3/3233* (2013.01); *G09G 3/3266* (2013.01); *G09G 3/3275* (2013.01);
(Continued)

(58) Field of Classification Search
CPC ... G09G 2300/0426; G09G 2300/0852; G09G 2300/0861; G09G 2310/0251; G09G 2310/0262; G09G 2310/08; G09G 2320/043; G09G 2330/021; G09G 3/3233; G09G 3/3266; G09G 3/3275;
(Continued)

(56) References Cited

U.S. PATENT DOCUMENTS 8,665,254 B2   3/2014   Chung et al.
8,816,943 B2   8/2014   Kawabe
(Continued)

FOREIGN PATENT DOCUMENTS

KR   10-2009-0003894   1/2009
KR      10-0952111    4/2010
(Continued)

*Primary Examiner* — Hong Zhou
(74) *Attorney, Agent, or Firm* — H.C. Park & Associates, PLC (57) ABSTRACT

A pixel capable of improving display quality may include an organic light emitting diode, a first transistor configured to control, in response to a voltage of a first node, current flowing from a first driving power source to a second driving power source via the organic light emitting diode, a second transistor coupled between the first node and a second electrode of the first transistor, and configured to be turned on when a scan signal is supplied to a scan line, a storage capacitor coupled between an initialization power source and the first node, a first capacitor coupled between the second electrode of the first transistor and a data line, and a second capacitor coupled between the first node and the second electrode of the first transistor. A display including such pixels also is disclosed.

16 Claims, 6 Drawing Sheets

(51) Int. Cl.
    *G09G 3/3275*     (2016.01)
    *H01L 27/32*     (2006.01)
    *H01L 27/12*     (2006.01)

(52) U.S. Cl.
    CPC ...... *H01L 27/3262* (2013.01); *H01L 27/3265* (2013.01); *G09G 2300/0426* (2013.01); *G09G 2310/08* (2013.01); *G09G 2330/021* (2013.01); *H01L 27/124* (2013.01); *H01L 27/1255* (2013.01); *H01L 27/3276* (2013.01)

(58) Field of Classification Search
    CPC . G09G 3/3262; H01L 27/124; H01L 27/1255; H01L 27/3262; H01L 27/3265; H01L 27/3276
    See application file for complete search history.

(56) References Cited

U.S. PATENT DOCUMENTS

| | | | |
|---|---|---|---|
| 9,117,407 B2 | 8/2015 | Kim | |
| 2006/0044244 A1* | 3/2006 | Numao | G09G 3/3233 345/92 |
| 2011/0018855 A1* | 1/2011 | Miyazawa | G09G 3/3233 345/211 |
| 2011/0069058 A1 | 3/2011 | Chung et al. | |
| 2013/0120337 A1* | 5/2013 | Guo | G09G 3/3208 345/211 |
| 2014/0139412 A1* | 5/2014 | Han | G09G 3/34 345/82 |
| 2014/0192037 A1* | 7/2014 | Chung | G09G 3/2022 345/212 |
| 2014/0307012 A1* | 10/2014 | Kishi | G09G 3/3233 345/691 |
| 2014/0313180 A1* | 10/2014 | Woo | H05B 33/0896 345/212 |
| 2016/0232840 A1* | 8/2016 | Tseng | G09G 3/3225 |
| 2017/0140724 A1* | 5/2017 | Lin | G09G 3/3648 |

FOREIGN PATENT DOCUMENTS

| | | |
|---|---|---|
| KR | 10-1058110 | 8/2011 |
| KR | 10-1058111 | 8/2011 |
| KR | 10-2013-0087128 | 8/2013 |
| KR | 10-1391100 | 4/2014 |
| KR | 10-1578761 | 12/2015 |

* cited by examiner

PIXEL AND ORGANIC LIGHT EMITTING DISPLAY DEVICE USING THE SAME

CROSS-REFERENCE TO RELATED APPLICATION

This application claims priority from and the benefit of Korean Patent Application No. 10-2017-0002883, filed on Jan. 9, 2017, which is hereby incorporated by reference for all purposes as if fully set forth herein.

BACKGROUND

Field

The invention relates generally to pixels and organic light emitting display devices using the pixels, and more particularly, to pixels and organic light emitting display devices using the pixels that may improve the display quality.

Discussion of the Background

As information technology develops, the importance of a display device that is a connecting medium between a user and information has been emphasized, and use of various display devices, such as a liquid crystal display (LCD) device and an organic light emitting display device, has increased.

An organic light emitting display device displays an image using an organic light emitting diode which emits light via re-coupling of electrons and holes. The organic light emitting display device has an advantage having a high response speed and low power consumption.

The organic light emitting display device includes pixels which are coupled with data lines and scan lines. Each of the pixels generally includes an organic light emitting diode and a driving transistor for controlling the amount of current flowing through the organic light emitting diode. Each pixel emits light having a predetermined luminance when current is supplied from the driving transistor to the organic light emitting diode in response to a data signal.

A pixel may include a plurality of transistors, for example, six or more transistors, and a plurality of capacitors, so as to compensate deviation in the threshold voltage of the driving transistor. In the case where a pixel includes a plurality of transistors, it is difficult to use the pixel and obtain a high-resolution display.

The above information disclosed in this Background section is only for enhancement of understanding of the background of the inventive concepts, and, therefore, it may contain information that does not constitute prior art.

SUMMARY

Applicants discovered that minimizing the number of transistors included in the pixels in an OLED may improve display quality. Pixels constructed according to the principles of the invention can minimize the number of required transistors in the pixels and may improve the display quality of an OLED containing the pixels.

OLEDs containing pixels constructed according to the principles of the invention may be configured to be driven during frame periods divided into an initialization period, a threshold voltage compensation period, a programming period, and a light emitting period by a power supply configured to supply at least first and second driving powers. The first driving power may be set as different voltages during the threshold voltage compensation period, the programming period, and the light emitting period.

Additional aspects will be set forth in the detailed description which follows, and, in part, will be apparent from the disclosure, or may be learned by practice of the inventive concepts.

According to one aspect of the invention, a pixel includes an organic light emitting diode, a first transistor configured to control, in response to a voltage of a first node, current flowing from a first driving power source to a second driving power source via the organic light emitting diode, a second transistor coupled between the first node and a second electrode of the first transistor, and configured to be turned on when a scan signal is supplied to a scan line, a storage capacitor coupled between an initialization power source and the first node, a first capacitor coupled between the second electrode of the first transistor and a data line, and a second capacitor coupled between the first node and the second electrode of the first transistor.

The second capacitor may have a higher capacitance than the capacitance of a channel capacitor disposed between a gate electrode of the first transistor and the second electrode.

The pixel may further include a third transistor coupled between the initialization power source and the second electrode of the first transistor, and configured to be turned on when a control signal is supplied to a control line.

The second transistor may include a plurality of transistors coupled in series to one another.

According to another aspect of the invention, an organic light emitting display device configured to be driven during frame periods, each of which is divided into an initialization period, a threshold voltage compensation period, a programming period, and a light emitting period includes pixels disposed to be coupled with scan lines and data lines, a scan driver configured to supply a scan signal to the scan lines, a control driver configured to supply a control signal to a control line coupled in common with the pixels; and a power supply configured to supply a first driving power, a second driving power, and an initialization power to the pixels. The first driving power supplied from the power supply may be set to different voltages during the threshold voltage compensation period, the programming period, and the light emitting period.

The power supply may supply the initialization power having a first voltage during the initialization period, the threshold voltage compensation period, and the programming period, and may supply the initialization power having a fifth voltage higher than the first voltage during the light emitting period.

The first voltage may be set such that an organic light emitting diode connected to on of the pixels is not emitted.

The power supply may supply the first driving power having a second voltage during the threshold voltage compensation period, may supply the first driving power having a third voltage higher than the second voltage during the programming period, and may supply the first driving power having a fourth voltage higher than the third voltage during the light emitting period.

The second voltage may be lower than the first voltage.

The third voltage may be set such that a driving transistor included in each of the pixels is turned off when a white data signal is supplied to the pixel.

Each of pixels disposed in an i-th (i is a natural number) horizontal line may include an organic light emitting diode, a first transistor configured to control, in response to a voltage of a first node, current flowing from the first driving power source to the second driving power source via the organic light emitting diode, a second transistor coupled between the first node and a second electrode of the first transistor, and configured to be turned on when a scan signal is supplied to an i-th scan line, a storage capacitor coupled between the initialization power source and the first node, a first capacitor coupled between the second electrode of the first transistor and a data line, a second capacitor coupled between the first node and the second electrode of the first transistor, and a third transistor coupled between the initialization power source and the second electrode of the first transistor, and configured to be turned on when the control signal is supplied to the control line.

The second capacitor may have a higher capacitance than the capacitance of a channel capacitor disposed between a gate electrode of the first transistor and the second electrode.

According to another aspect of the invention, a method of driving an organic light emitting display device during frame periods, each of which is divided into an initialization period, a threshold voltage compensation period, a programming period, and a light emitting period, the method includes the steps of coupling pixels with scan lines and data lines, supplying a scan signal from a scan driver to the scan lines, supplying a control signal from a control driver to a control line coupled in common with the pixels, and supplying a first driving power from a power supply to the pixels as different voltages during the threshold voltage compensation period, the programming period, and the light emitting period.

The driving method may further include the steps of supplying an initialization power having a first voltage during the initialization period, the threshold voltage compensation period and the programming period, and supplying the initialization power having a fifth voltage higher than the first voltage during the light emitting period.

The step of supplying an initialization power having a first voltage during the initialization period, the threshold voltage compensation period and the programming period may include supplying the first voltage at a level that does not cause an organic light emitting diode connected to one of the pixels to emit.

The step of supplying a first driving power may include supplying the first driving power having a second voltage during the threshold voltage compensation period, supplying the first driving power having a third voltage higher than the second voltage during the programming period, and supplying the first driving power having a fourth voltage higher than the third voltage during the light emitting period.

The second voltage may be lower than the first voltage.

The third voltage may be set such that a driving transistor included in each of the pixels is turned off when a white data signal is supplied to the pixels.

The driving method may further include the step of supplying a second driving power from a power supply to the pixels.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Figure 1:
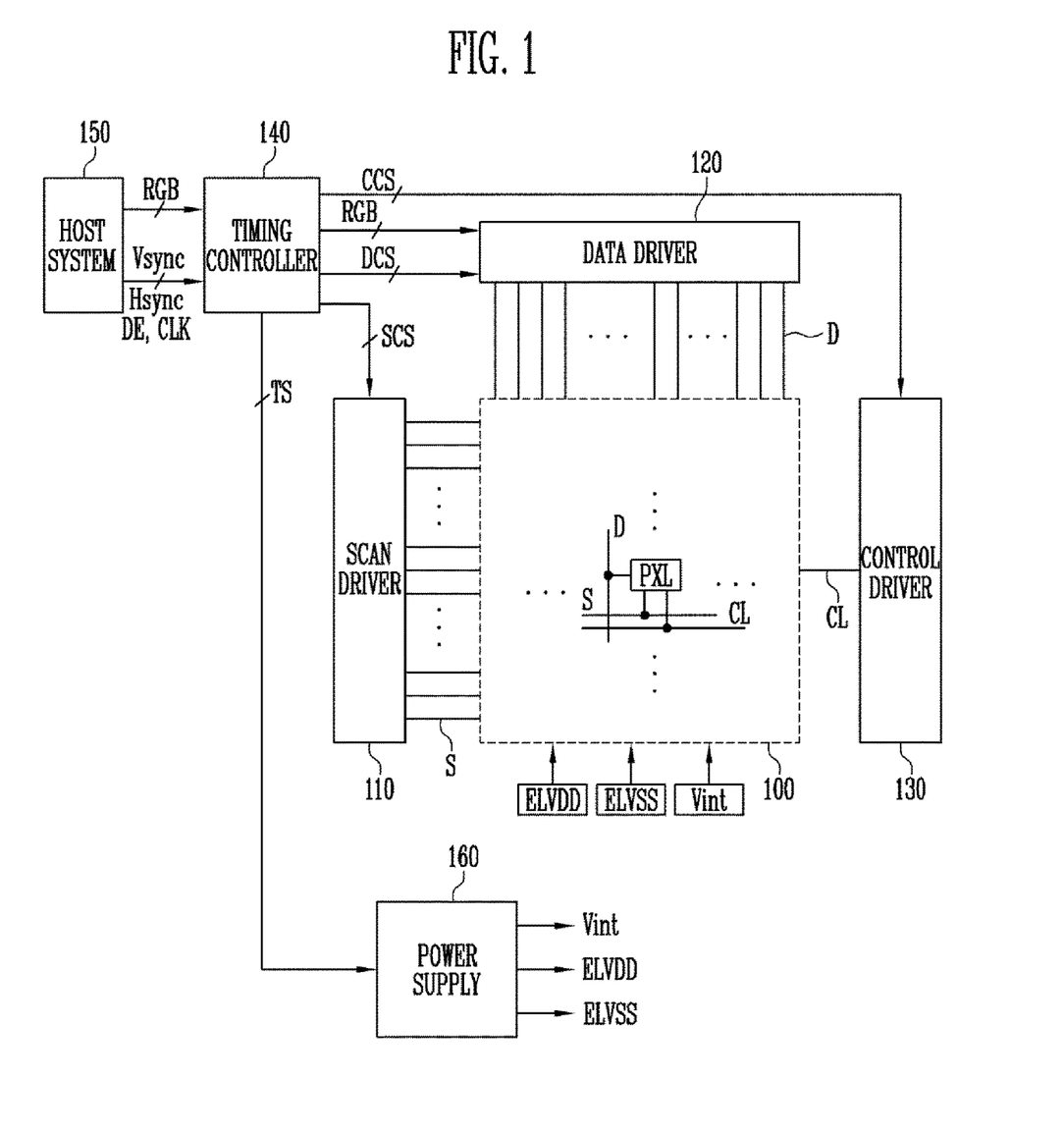
FIG. 1 is a schematic diagram of an organic light emitting display device constructed according to the principles of the invention.

FIG. 1 is a schematic diagram of an organic light emitting display device constructed according to the principles of the invention.

Referring to FIG. 1, the organic light emitting display device includes a pixel unit 100, a scan driver 110, a data driver 120, a control driver 130, a timing controller 140, a host system 150, and a power supply 160.

The host system 150 supplies image data RGB to the timing controller 140 through a predetermined interface. Furthermore, the host system 150 supplies a vertical synchronization signal Vsync, a horizontal synchronization signal Hsync, a data enable signal DE, a clock signal CLK, etc. to the timing controller 140.

The timing controller 140 generates a scan driving control signal SCS, a data driving control signal DCS, a control driving control signal CCS, and a timing signal TS, in response to the vertical synchronization signal Vsync, the horizontal synchronization signal Hsync, the data enable signal DE, the clock signal CLK, etc. that are outputted from the host system 150.

The scan drive control signal SCS generated from the timing controller 140 is supplied to the scan driver 110. The data driving control signal DCS is supplied to the data driver 120. The control driving control signal CCS is supplied to the control driver 130. The timing signal TS is supplied to the power supply 160. The timing controller 140 rearranges the image data RGB supplied from an external device and supplies the rearranged image data RGB to the data driver 120.

The scan driving control signal SCS may include a scan start pulse and clock signals. The scan start pulse controls a first timing of a scan signal. The clock signals are used to shift the scan start pulse.

The data driving control signal DCS may include a source start pulse and clock signals. The source start pulse controls the time at which data sampling starts. The clock signals are used to control a sampling operation.

The control driving control signal CCS controls the control driver 130. The control driving control signal CCS may include a control start pulse.

Figure 3:
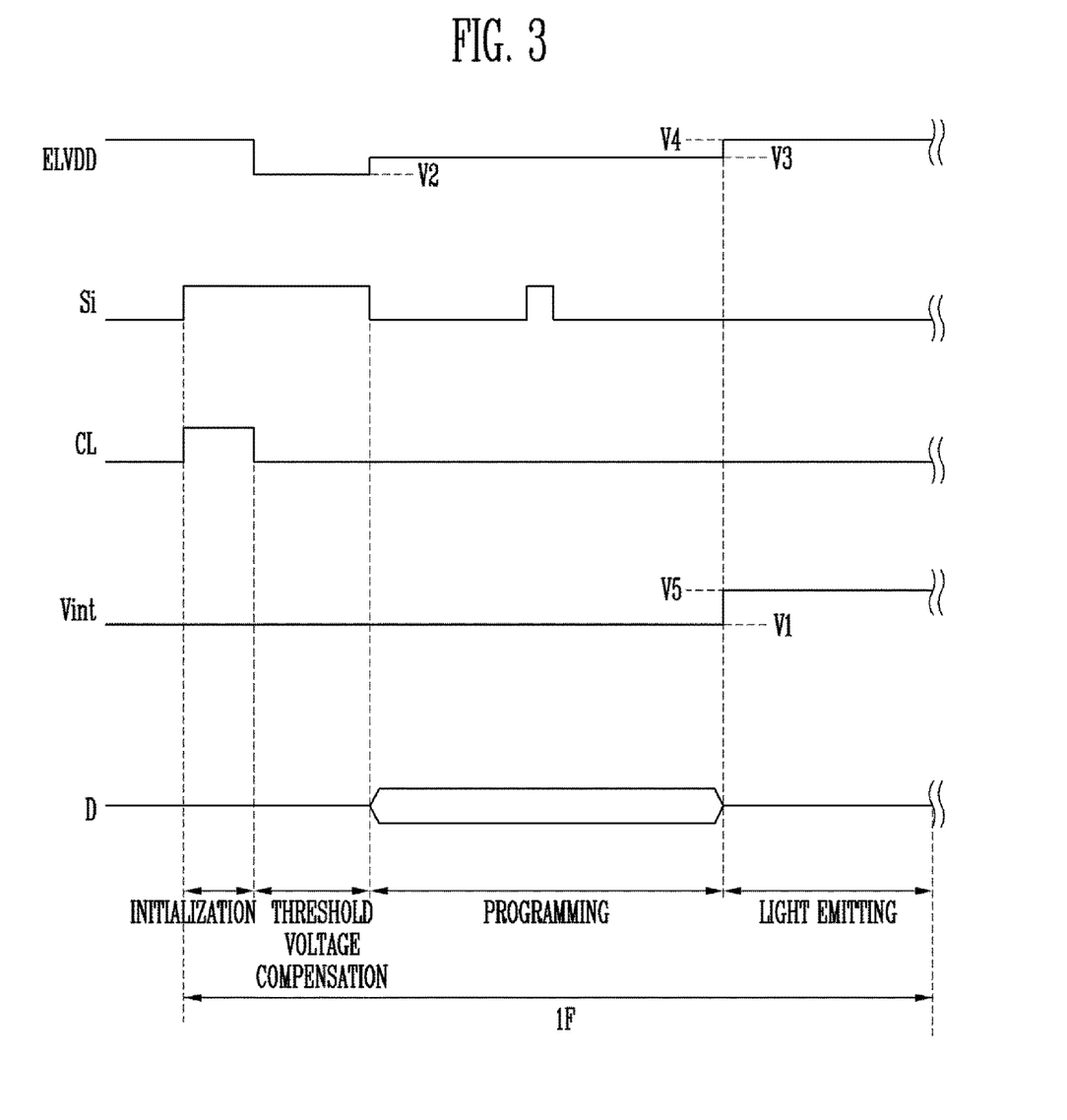
FIG. 3 is a timing diagram illustrating an exemplary method of driving the pixel of FIG. 2.

The timing signal TS may include signals for dividing each frame period into several periods. For example, the timing signal TS may include signals for dividing each frame period into an initialization period, a threshold voltage compensation period, a programming period, and a light emitting period, as shown in FIG. 3.

The scan driver 110 supplies a scan signal to scan lines S in response to the scan driving control signal SCS. For example, as shown in FIG. 3, the scan driver 110 may simultaneously supply the scan signal to the scan lines S during the initialization period and the threshold voltage compensation period. The scan driver 110 may sequentially supply the scan signal to the scan lines S during the programming period. When the scan signal is supplied to the scan lines S, the corresponding pixels PXL are selected. For this operation, the scan signal may be set as a gate-on voltage so that transistors included in the pixels PXL can be turned on.

In addition, the scan driver 110 may be mounted on a substrate through a thin film process. The scan driver 110 may be disposed on each of the opposite sides of the pixel unit 100.

The data driver 120 supplies a data signal to data lines D in response to the data driving control signal DCS. For example, the data driver 120 may supply the data signal to the data lines D in synchronization with the scan signal supplied to the scan lines S during the programming period. The data signal supplied to the data lines D is supplied to pixels PXL selected by the scan signal. The data driver 120 supplies a predetermined voltage to the data lines D during the periods (the initialization period, the threshold voltage compensation period, and the light emitting period) other than the programming period. The predetermined voltage may be set to a certain voltage within a voltage range of a data signal that can be supplied from the data driver 120.

The control driver 130 supplies a control signal to the control line CL during the initialization period. When the control signal is supplied to the control line CL, the driving transistors included in each of the pixels PXL may be initialized. For this operation, the control signal may be set as a gate-on voltage so that transistors included in the pixels PXL can be turned on. In addition, the control line CL may be coupled in common with the pixels PXL, so that the pixels PXL may be operated in a simultaneous driving manner.

Although the control driver 130 is illustrated in FIG. 1 as being a driver provided separately from the scan driver 110, the inventive concepts are not limited thereto. For example, the control driver 130 and the scan driver 110 may be embodied as a single driver.

The power supply 160 generates the initialization power Vint, the first driving power ELVDD, and the second driving power ELVSS, and supplies them to the pixels PXL.

The power supply 160 supplies an initialization power Vint having a first voltage V1 to the pixels PXL during the initialization period, the threshold voltage compensation period, and the programming period, and supplies an initialization power Vint having a fifth voltage V5 to the pixels PXL during the light emitting period. The fifth voltage V5 may be set to a voltage higher than the first voltage V1.

The power supply 160 supplies a first driving power ELVDD having a second voltage V2 to the pixels PXL during the threshold voltage compensation period, and supplies a first driving power ELVDD having a third voltage V3 to the pixels PXL during the programming period. Furthermore, the power supply 160 supplies a first driving power ELVDD having a fourth voltage V4 to the pixels PXL during the light emitting period. The second voltage V2 may be set to a voltage lower than the fourth voltage V4. The third voltage V3 may be set to a voltage between the second voltage V2 and the fourth voltage V4.

The power supply 160 supplies a second driving power ELVSS having a predetermined voltage to the pixels PXL during each frame period IF. The second driving power ELVSS may be set to a voltage lower than the fourth voltage V4 so that the pixels PXL can emit light during the light emitting period.

The pixel unit 100 includes pixels PXL which are disposed to be coupled with the data lines D, the scan lines S, and the control line CL. The pixels PXL may be supplied with the first driving power ELVDD, the second driving power ELVSS, and the initialization power Vint from the power supply 160.

Each of the pixels PXL may be supplied with a data signal from the corresponding data line D during the programming period. During the light emitting period, the pixel PXL supplied with the data signal may control, in response to the data signal, the amount of current flowing from the first driving power source ELVDD to the second driving power source ELVSS via an organic light emitting diode. The organic light emitting diode may generate light having a predetermined luminance in response to the current.

Figure 2:
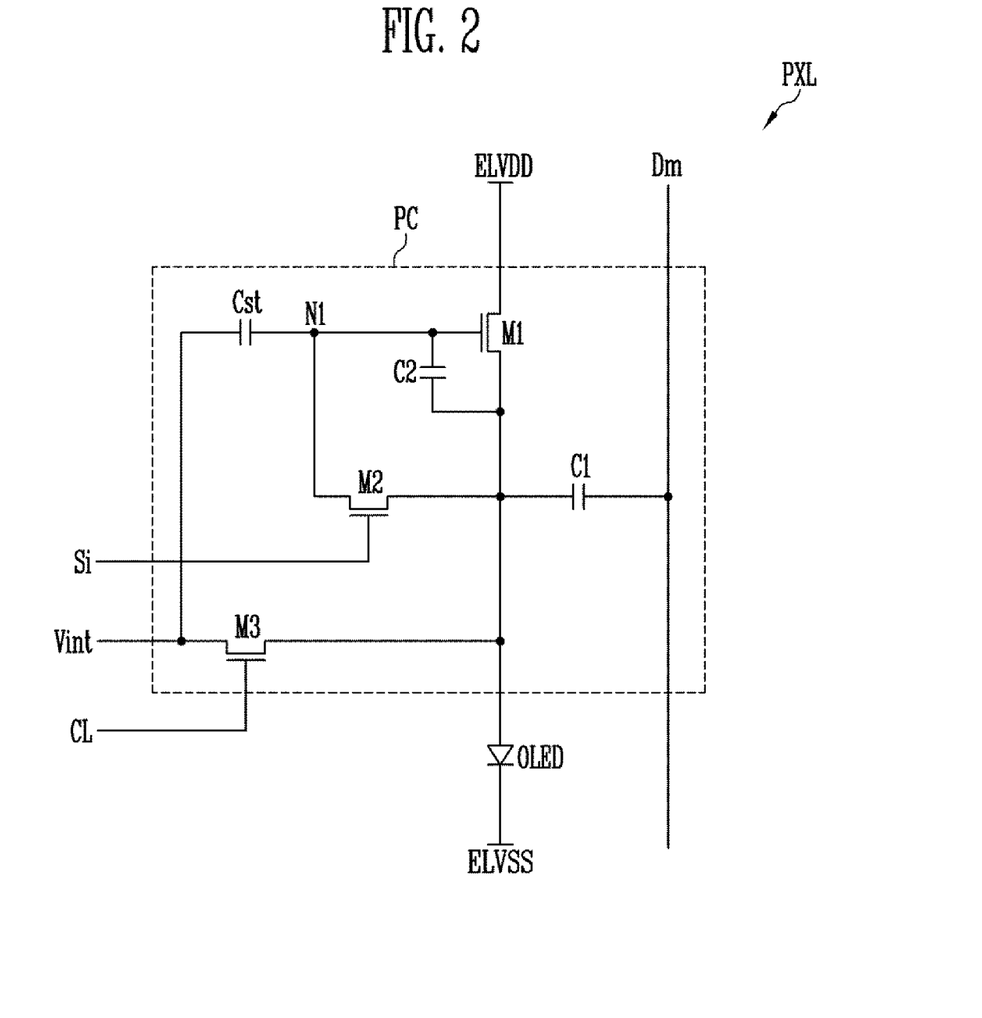
FIG. 2 is a schematic diagram illustrating an embodiment of a pixel of the organic light emitting display device of FIG. 1.

FIG. 2 is a schematic diagram illustrating an embodiment of a pixel of the organic light emitting display device of FIG. 1. For descriptive convenience, FIG. 2 illustrates a pixel coupled to an i-th scan line Si and an m-th data line Dm.

Referring to FIG. 2, the pixel PXL includes an organic light emitting diode OLED and a pixel circuit PC configured to control the amount of current to be supplied to the organic light emitting diode OLED.

An anode electrode of the organic light emitting diode OLED is coupled to the pixel circuit PC, and a cathode electrode of the organic light emitting diode OLED is coupled to a second driving power ELVSS. The organic light emitting diode OLED may generate light having a predetermined luminance corresponding to current supplied from the pixel circuit PC during a light emitting period.

During the light emitting period, the pixel circuit PC controls, in response to the data signal, the amount of current flowing from the first driving power source ELVDD to the second driving power source ELVSS via the organic light emitting diode OLED. For this operation, the pixel circuit PC may include first to third transistors M1 to M3, a storage capacitor Cst, a first capacitor C1, and a second capacitor C2. Each of the first to third transistors M1 to M3 may be formed of an N-type transistor (e.g., an NMOS transistor).

A first electrode of the first transistor M1 (or the driving transistor) is coupled to the first driving power source ELVDD, and a second electrode the first transistor M1 is coupled to the anode electrode of the organic light emitting diode OLED. A gate electrode of the first transistor M1 is coupled to a first node N1. The first transistor M1 may control, in response to a voltage of the first node N1, the amount of current flowing from the first driving power source ELVDD to the second driving power source ELVSS via the organic light emitting diode OLED.

The second transistor M2 is coupled between the first node N1 and the second electrode of the first transistor M1. A gate electrode of the second transistor M2 is coupled to the i-th scan line Si. The second transistor M2 may be turned on when a scan signal is supplied to the i-th scan line Si.

The third transistor M3 is coupled between the initialization power source Vint and the anode electrode of the organic light emitting diode OLED. A gate electrode of the third transistor M3 is coupled to the control line CL. The third transistor M3 may be turned on when a control signal is supplied to the control line CL.

The storage capacitor Cst is coupled between the initialization power source Vint and the first node N1. The storage capacitor Cst may store a voltage corresponding to a data signal and a threshold voltage of the first transistor M1.

The first capacitor C1 is coupled between the data line Dm and the second electrode of the first transistor M1. The first capacitor C1 may control a voltage of the second electrode of the first transistor M1 in response to a voltage of the data line Dm.

The second capacitor C2 is coupled between the first node N1 and the second electrode of the first transistor M1. The second capacitor C2 may be set to have a capacitance higher than that of a channel capacitor formed between the gate electrode and the second electrode of the first transistor M1. Thereby, after the second transistor M2 being turned off, variation in voltage of the first node N1 corresponding to the voltage of the data line Dm may be minimized.

FIG. 3 is a timing diagram illustrating an exemplary method of driving the pixel of FIG. 2.

Referring to FIG. 3, each frame period IF is divided into an initialization period, a threshold voltage compensation period, a programming period, and a light emitting period.

During the initialization period, the first node N1 and the anode electrode of the organic light emitting diode OLED may be initialized by the initialization power Vint having the first voltage V1.

During the threshold voltage compensation period, a voltage corresponding to the threshold voltage of the first transistor M1 may be stored in the storage capacitor Cst.

During the programming period, a voltage corresponding to a data signal may be stored in the storage capacitor Cst.

During the light emitting period, the organic light emitting diode OLED may generate light having a predetermined luminance corresponding to current supplied from the pixel circuit PC.

With regard to an exemplary operation process, during the initialization period, a scan signal is supplied to all of the scan lines S, and a control signal is supplied to the control line CL.

When the control signal is supplied to the control line CL, the third transistor included in each of the pixels PXL is turned on. When the third transistor M3 is turned on, the voltage of the initialization power source Vint is supplied to the anode electrode of the organic light emitting diode OLED.

When the scan signal is supplied to the scan lines S, the second transistor M2 included in each of the pixels PXL is turned on. When the second transistor M2 is turned on, the voltage of the initialization power source Vint is supplied to the first node N1. In other words, during the initialization period, the anode electrode of the organic light emitting diode OLED and the first node N1 that are included in each pixel PXL are initialized to have the first voltage V1 (i.e., the voltage of the initialization power source Vint). Here, the first voltage V1 is set such that the organic light emitting diode OLED is not emitting.

During the threshold voltage compensation period, the supply of the control signal to the control line CL is interrupted, and the first driving power source ELVDD is set to the second voltage V2. The second voltage V2 is set to a voltage lower than the first voltage V1. During the threshold voltage compensation period, the supply of the scan signal to the scan lines S is maintained.

When the scan signal is supplied to the scan lines S, the second transistor M2 included in each of the pixels PXL is maintained in the turned-on state. When the second transistor M2 is turned on, the first transistor M1 is connected in the form of a diode so that current can flow from the anode electrode of the organic light emitting diode OLED to the first driving power source ELVDD.

When the supply of the control signal to the control line CL is interrupted, the third transistor M3 included in each of the pixels PXL is turned off. Then, current is supplied to the first driving power source ELVDD from the first node and the anode electrode of the organic light emitting diode OLED, which have been set to the first voltage V1, to the first driving power source having the second voltage V2.

Here, because the first transistor M1 is connected in the form of a diode, as described above, the voltage of the first node N1 may be set to the sum of the second voltage V2 of the first driving power source ELVDD and the absolute threshold voltage of the first transistor M1. In other words, during the threshold voltage compensation period, a voltage corresponding to the threshold voltage of the first transistor M1 may be applied to the first node N1. During the threshold voltage compensation period, the storage capacitor Cst stores a voltage corresponding to the threshold voltage of the first transistor M1 that is applied to the first node N1.

During the initialization period and the threshold voltage compensation period, the scan signal is simultaneously supplied to all of the scan lines S. Therefore, during the initialization period and the threshold voltage compensation period, the storage capacitor Cst included in each of the pixels PXL stores a voltage corresponding to the threshold voltage of the first transistor M1 coupled to the each of the pixels PXL.

During the programming period, the scan signal is sequentially supplied to the scan lines S. The first driving power ELVDD is set to the third voltage V3 higher than the second voltage V2.

When a scan signal is supplied to the i-th scan line Si, the second transistor M2 coupled with the i-th scan line Si is turned on. When the second transistor M2 is turned on, the first node N1 is electrically coupled with the second electrode of the first transistor M1.

A data signal is supplied to the data line Dm in synchronization with the i-th scan line Si. When the data signal is supplied to the data line Dm, the voltage of the first node N1 and the second electrode of the first transistor M1 are changed by coupling of the first capacitor C1. In other words, during the programming period, the voltage of the first node N1 is set to correspond to the voltage of the data signal. During the programming period, the storage capacitor Cst stores the voltage of the first node N1. In other words, a voltage corresponding to the data signal and the threshold voltage of the first transistor M1 is stored in the storage capacitor Cst.

During the programming period, the scan signal is sequentially supplied to the scan lines S. Then, the second transistors M2 included in each of the pixels PXL is turned on, on a horizontal line basis. Hence, a voltage corresponding to the associated data signal is stored in each of the pixels PXL.

During the programming period, the first driving power source ELVDD is set to the third voltage V3. The third voltage V3 is set to a voltage at which the first transistor M1 can be maintained in the turned-off state when a white data signal is supplied thereto.

During the light emitting period, the first driving power source ELVDD is set to the fourth voltage V4 higher than the third voltage V3. Furthermore, during the light emitting period, the initialization power source Vint is set to the fifth voltage V5.

When the initialization power source Vint is set to the fifth voltage V5, i.e., when the initialization power source Vint increases from the first voltage V1 to the fifth voltage V5, the voltage of the first node N1 is increased by coupling of the storage capacitor Cst. Here, the first transistor M1 may control, in response to the voltage of the first node N1, the amount of current flowing from the first driving power source ELVDD set as the fourth voltage V4 to the second driving power source ELVSS via the organic light emitting diode OLED. For this operation, the fourth voltage V4 and the fifth voltage V5 may be set such that current can be reliably supplied to the pixels PXL.

As described above, the pixels PXL according to an exemplary embodiment may generate light having a predetermined luminance while passing through the initialization period, the threshold voltage compensation period, the programming period, and the light emitting period during each frame period IF.

In an exemplary embodiment, during the programming period, the first driving power source ELVDD may be set to the third voltage V3 lower than the fourth voltage V4. Then, during the programming period, the voltage of the first node N1 may be prevented from changing due to leakage current of the first driving power source ELVDD.

In other words, when the first driving power source ELVDD is set to the fourth voltage V4 during the programming period, the voltage of the first node N1 may be changed by leakage current of the first driving power source ELVDD. Therefore, in an exemplary embodiment, during the programming period, the voltage of the first driving power source ELVDD may be set to the third voltage V3 lower than the fourth voltage V4, thereby minimizing leakage current from the first driving power source ELVDD.

Furthermore, in an exemplary embodiment, a change in voltage of the first node N1 corresponding to a change in voltage of the data line Dm during the programming period may be minimized by the second capacitor C2.

In detail, a channel capacitor is formed between the gate electrode and the second electrode of the first transistor M1. Therefore, even when the second transistor M2 is turned off, the voltage of the first node N1 may be changed in response to a change in voltage of the data line Dm. For example, the voltage of the first node N1 may be changed to correspond to the capacities of the first capacitor C1 and the channel capacitor.

To prevent this, in an exemplary embodiment, the second capacitor C2 having a capacitance higher than that of the channel capacitor may be formed between the gate electrode and the second electrode of the first transistor M1. When the second capacitor C2 is formed, the voltage of the first node N1 may be changed to correspond to the capacities of the first capacitor C1 and the second capacitor C2.

For instance, a variation in voltage of the first node N1 may be expressed by $\Delta V/(C1+C2)$ ($\Delta V$ denotes a variation in voltage of the data line). In other words, when the second capacitor C2 having a comparatively high capacitance is formed in lieu of the channel capacitor, a variation in voltage of the first node N1 corresponding to a variation in voltage of the data line Dm may be minimized.

Figure 4:
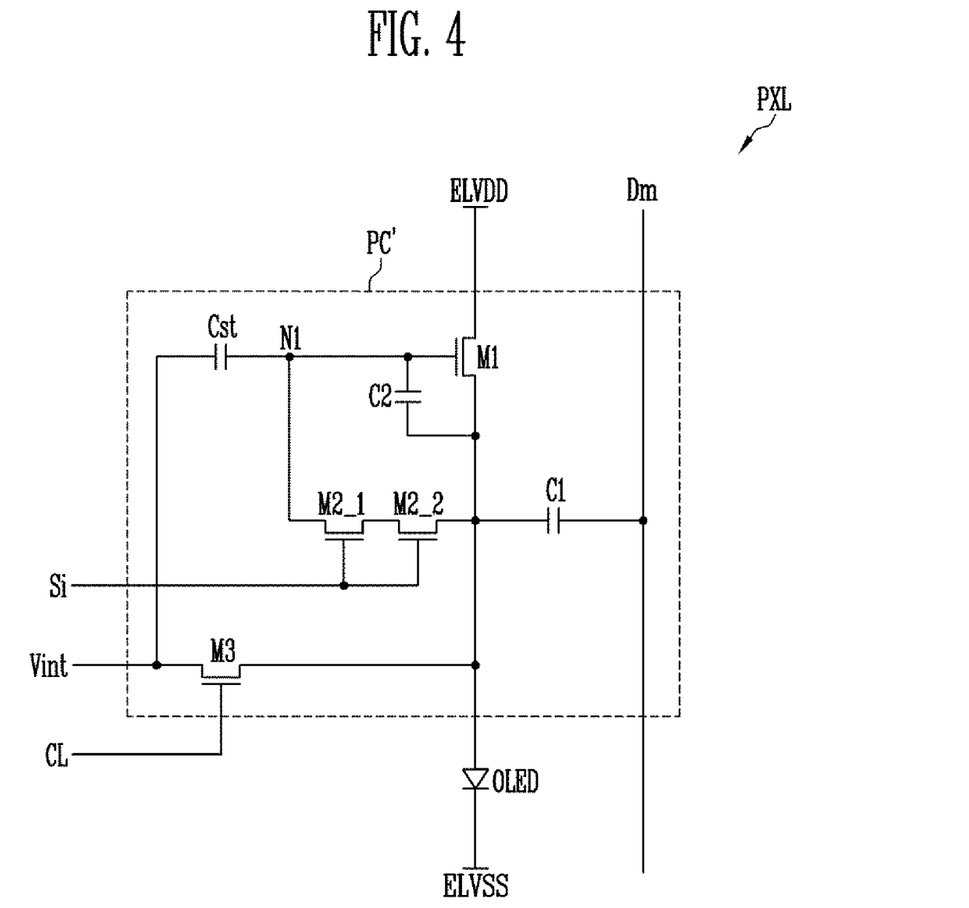
FIG. 4 is a schematic diagram illustrating another embodiment of a pixel of the organic light emitting display device of FIG. 1.

FIG. 4 is a schematic diagram illustrating another embodiment of a pixel of the organic light emitting display device of FIG. 1. In the following description of FIG. 4, the same reference numerals will be used to designate the same components as those of FIG. 2, and detailed explanation thereof will be omitted to avoid redundancy.

Referring to FIG. 4, the pixel PXL includes an organic light emitting diode OLED and a pixel circuit PC' configured to control the amount of current to be supplied to the organic light emitting diode OLED.

An anode electrode of the organic light emitting diode OLED is coupled to the pixel circuit PC', and a cathode electrode of the organic light emitting diode OLED is coupled to a second driving power ELVSS. The organic light emitting diode OLED may generate light having a predetermined luminance corresponding to current supplied from the pixel circuit PC' during the light emitting period.

During the light emitting period, the pixel circuit PC' may control, in response to the data signal, the amount of current flowing from the first driving power source ELVDD to the second driving power source ELVSS via the organic light emitting diode OLED. For this operation, the pixel circuit PC' may include first to third transistors M1 to M3, a storage capacitor Cst, a first capacitor C1, and a second capacitor C2.

The second transistor M2_1, M2_2 are formed as a plurality of transistors coupled in series between the first node N1 and the second electrode of the first transistor M1. Gate electrodes of the second transistors M2_1 and M2_2 are coupled to the i-th scan line Si. The second transistors M2_1 and M2_2 may be turned on when a scan signal is supplied to the i-th scan line Si.

The general configuration of the pixel PXL in accordance with the illustrated embodiment, other than the fact that the plurality of second transistors M2_1 and M2_2 are provided, may be the same as that of the pixel PXL of FIG. 2. If the plurality of second transistors M2_1 and M2_2 are provided, the voltage of the first node N1 may be prevented from changing due to leakage current. Therefore, the operational reliability of the pixel PXL may be improved.

Figure 5:
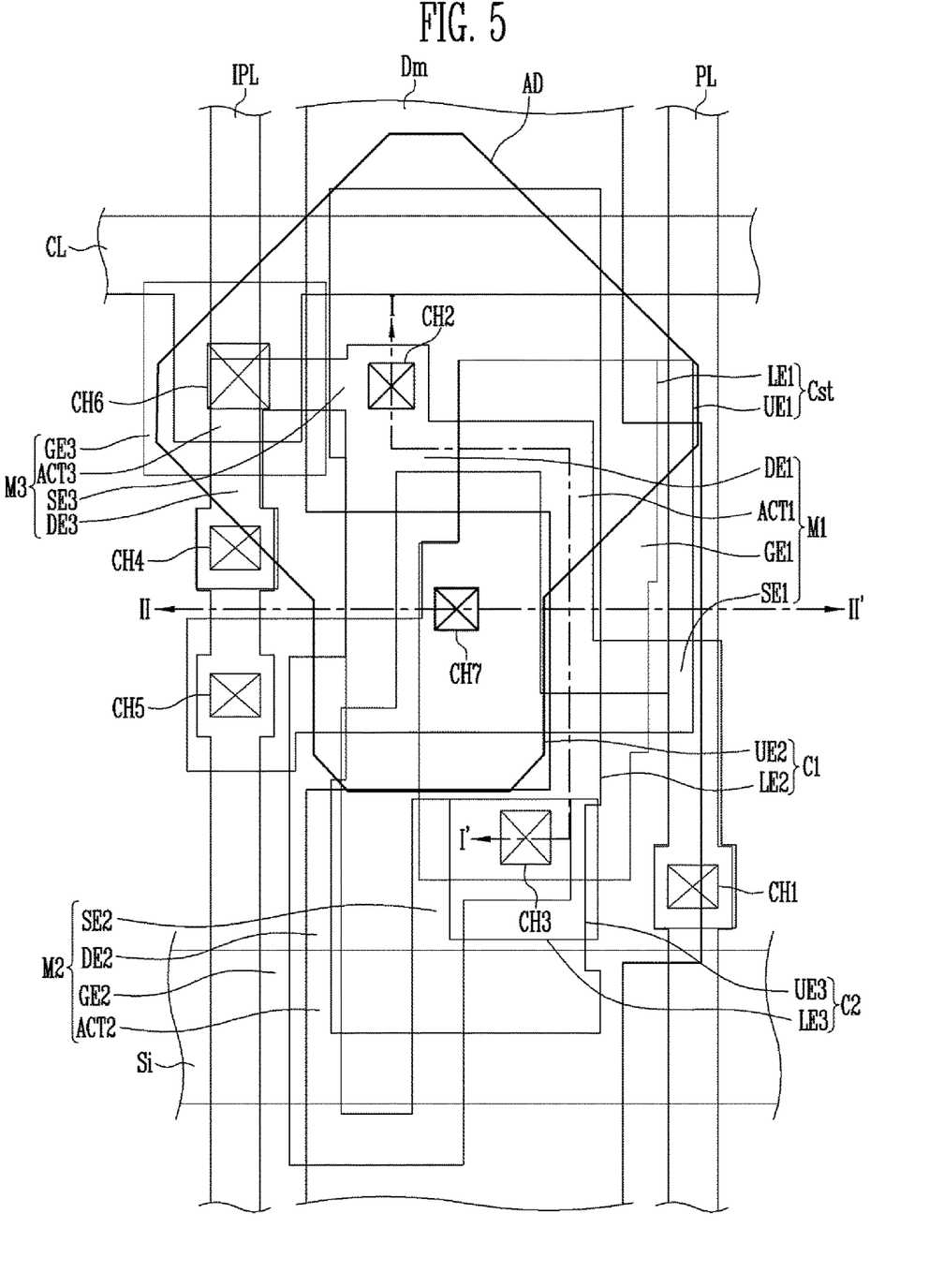
FIG. 5 is a schematic plan view of the pixel of FIG. 2.
Figure 6:
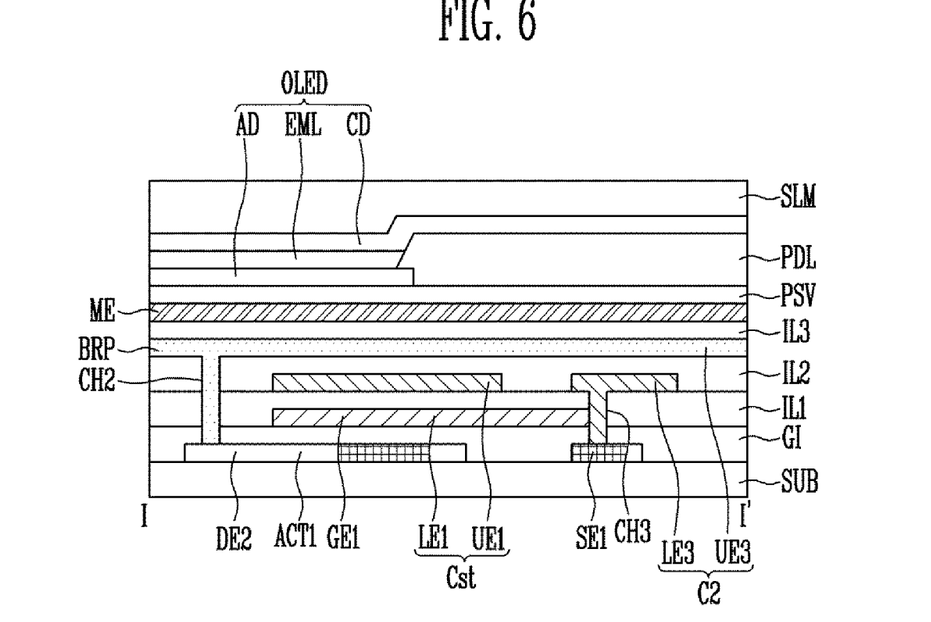
FIG. 6 is a cross-sectional view of the pixel of FIG. 5 taken along sectional line I-I' of FIG. 5.
Figure 7:
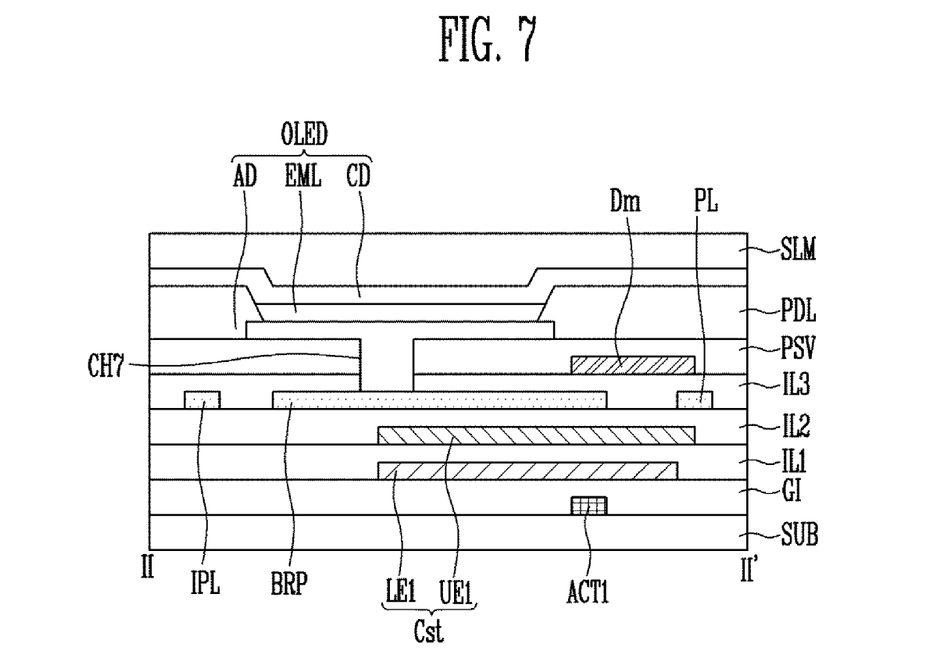
FIG. 7 is a cross-sectional view of the pixel of FIG. 5 taken along sectional line II-II' of FIG. 5.

FIG. 5 is a schematic plan view of the pixel of FIG. 2. FIG. 6 is a cross-sectional view of the pixel of FIG. 5 taken along sectional line I-I' of FIG. 5. FIG. 7 is a cross-sectional view of the pixel of FIG. 5 taken along sectional line II-II' of FIG. 5. For descriptive convenience, FIGS. 5 to 7 illustrate a pixel coupled to an i-th scan line Si and an m-th data line Dm.

Referring to FIGS. 5 to 7, the organic light emitting display device may include a substrate SUB and pixels PXL disposed on the substrate SUB.

The substrate SUB may include transparent insulating material to allow light to pass therethrough. The substrate SUB may be a rigid substrate. For example, the substrate SUB may be one of a glass substrate, a quartz substrate, a glass ceramic substrate, and a crystalline glass substrate.

The substrate SUB may be a flexible substrate. Here, the substrate SUB may be either a film substrate or a plastic substrate which includes polymer organic material. For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the materials constituting the substrate SUB may be changed, and include, for example, fiber reinforced plastic FRP.

The pixels PXL may be coupled to the scan line Si, the data line Dm, the control line CL, a power line PL, and an initialization power line IPL. The scan line Si and the control line CL may extend in one direction and may be disposed spaced apart from each other. The scan line Si may receive an i-th scan signal. During the initialization period, the control line CL may receive a control signal. The data line Dm may extend in a direction intersecting the scan line Si and the control line CL. The data line Dm may receive a data signal. The power line PL may extend in a direction intersecting the scan line Si and the control line CL. The first driving power ELVDD may be applied to the power line PL as shown in FIGS. 1 and 2.

The initialization power line IPL may extend in a direction intersecting the scan line Si and the control line CL. The initialization power Vint may be applied to the initialization power line IPL as shown in FIGS. 1 and 2.

Each of the pixels PXL may include a first transistor M1, a second transistor M2, a third transistor M3, a first capacitor C1, a second capacitor C2, a storage capacitor Cst, and an organic light emitting diode OLED.

The first transistor M1 may include a first gate electrode GE1, a first active pattern ACT1, a first drain electrode DE1, and a first source electrode SE1. The first gate electrode GE1 may be coupled to the storage capacitor Cst and the second capacitor C2. The first drain electrode DE1 may be coupled to the power line PL through a first contact hole CH1. The first source electrode SE1 may be coupled to a first electrode AD of the organic light emitting diode OLED.

In an exemplary embodiment of the invention, each of the first active pattern ACT1, the first drain electrode DE1, and the first source electrode SE1 may be formed of an undoped semiconductor layer or a semiconductor layer doped with an impurity. For example, each of the first drain electrode DE1 and the first source electrode SE1 may be formed of a semiconductor layer doped with an impurity. The first active pattern ACT1 may be formed of an undoped semiconductor layer. The first active pattern ACT1 may have a bar shape extending in a predetermined direction and may be bent several times along the longitudinal direction. The first active pattern ACT1 may correspond to a portion of the first transistor M1 that overlaps the first gate electrode GE1. The first active pattern ACT1 may overlap the first gate electrode GE1 in a plan view. As the first active pattern ACT1 is formed in a relatively long shape, a channel area of the first transistor M1 may also be formed in a relatively long shape.

A first end of the first drain electrode DE1 may be coupled to the power line PL, and a second end of the first drain electrode DE1 may be coupled to a first end of the first active pattern ACT1. A first end of the first source electrode SE1 may be coupled to a second end of the first active pattern ACT1. A second end of the first source electrode SE1 may be coupled to a third drain electrode DE3 of the third transistor M3. The second end of the first source electrode SE1 may be coupled to a bridge pattern BRP through a second contact hole CH2.

The second transistor M2 may include a second gate electrode GE2, a second active pattern ACT2, a second drain electrode DE2, and a second source electrode SE2. The second gate electrode GE2 may be coupled to the scan line Si. The second gate electrode GE2 may be provided as a part of the scan line Si or formed to have a shape protruding from the scan line Si.

In an exemplary embodiment of the invention, each of the second active pattern ACT2, the second drain electrode DE2, and the second source electrode SE2 may be formed of an undoped semiconductor layer or a semiconductor layer doped with an impurity. For example, each of the second drain electrode DE2 and the second source electrode SE2 may be formed of a semiconductor layer doped with an impurity. The second active pattern ACT2 may be formed of an undoped semiconductor layer. The second active pattern ACT2 may correspond to a portion of the second transistor M2 that overlaps the second gate electrode GE2. A first end of the second drain electrode DE2 may be coupled to the second active pattern ACT2. A second end of the second drain electrode DE2 may be coupled to a third lower electrode LE3 of the second capacitor C2 through a third contact hole CH3. A first end of the second source electrode SE2 may be coupled to the second active pattern ACT2. A second end of the second source electrode SE2 may be coupled to the first source electrode SE1 of the first transistor M1. The second end of the second source electrode SE2 may be coupled to the second capacitor C2 through the second contact hole CH2.

The third transistor M3 may include a third gate electrode GE3, a third active pattern ACT3, a third drain electrode DE3, and a third source electrode SE3. The third gate electrode GE3 may be coupled to the control line CL through a sixth contact hole CH6.

In an exemplary embodiment, each of the third active pattern ACT3, the third drain electrode DE3, and the third source electrode SE3 may be formed of an undoped semiconductor layer or a semiconductor layer doped with an impurity. For example, each of the third drain electrode DE3 and the third source electrode SE3 may be formed of a semiconductor layer doped with an impurity. The third active pattern ACT3 may be formed of an undoped semiconductor layer. The third active pattern ACT3 may correspond to a portion of the third transistor M3 that overlaps the third gate electrode GE3. A first end of the third drain electrode DE3 may be coupled to the third active pattern ACT3. A second end of the third drain electrode DE3 may be coupled to the first source electrode SE1 of the first transistor M1. The second end of the third drain electrode DE3 may be coupled to the bridge pattern BRP through the second contact hole CH2. A first end of the third source electrode SE3 may be coupled to the third active pattern ACT3. A second end of the third source electrode SE3 may be coupled to the initialization power line IPL through a fourth contact hole CH4.

The organic light emitting diode OLED may include the first electrode AD, a second electrode CD, and a light emitting layer EML provided between the first electrode AD and the second electrode CD. The first electrode AD may be provided in an emission area corresponding to each pixel PXL. The first electrode AD may be coupled to the bridge pattern BRP through a seventh contact hole CH7. Because the bridge pattern BRP is electrically coupled to the first source electrode SE1 through the second contact hole CH2, the first electrode AD may be electrically coupled to the first source electrode SE1. The first electrode AD may be electrically coupled to the power line PL and thus may be supplied with a first power source ELVDD as shown in FIGS. 2 and 3. The second electrode CD may be coupled to a second power source ELVSS as shown in FIGS. 2 and 3.

The storage capacitor Cst may include a first lower electrode LE1 and a first upper electrode UE1. The first lower electrode LE1 may be formed of the first gate electrode GE1 of the first transistor T1. The first upper electrode UE1 may overlap the first gate electrode GE1 and cover at least a portion of the first lower electrode LE1 in a plan view. The capacitance of the storage capacitor Cst may be increased by increasing the area of the overlapped portion between the first lower electrode LE1 and the first upper electrode UE1. The first upper electrode UE1 may be coupled to the initialization power line IPL through a fifth contact hole CH5. In other words, the first upper electrode UE1 may be supplied with power having substantially the same level as that of the initialization power Vint.

The first capacitor C1 may include a second lower electrode LE2 and a second upper electrode UE2. The second lower electrode LE2 may be formed on substantially the same layer as that of the bridge pattern BRP and may be made of substantially the same material as that of the bridge patter BRP. The second lower electrode LE2 may be provided as a part of the bridge pattern BRP or formed to have a shape protruding from the bridge pattern BRP. The second upper electrode UE2 may cover at least a portion of the second lower electrode LE2 in a plan view. The second upper electrode UE2 may be formed on substantially the same layer as that of the first electrode AD of the organic light emitting diode OLED and be made of substantially the same material as that of the first electrode AD. The second upper electrode UE2 may be provided as a part of the first electrode AD or formed to have a shape protruding from the first electrode AD.

The first capacitor C1 may include an intermediate electrode ME provided between the second lower electrode LE2 and the second upper electrode UE2. Based on the intermediate electrode ME, the first capacitor C1 may include a first sub-capacitor formed of the second lower electrode LE2 and the intermediate electrode ME, and a second sub-capacitor formed of the second upper electrode UE2 of the organic light emitting diode OLED and the intermediate electrode ME. The first sub-capacitor and the second sub-capacitor may be coupled in parallel with each other and may increase the capacitance of the first capacitor C1. The intermediate electrode ME may be coupled to the data line Dm. For example, the intermediate electrode ME may be provided as a part of the data line Dm or formed to have a shape protruding from the data line Dm.

The second capacitor C2 may include a third lower electrode LE3 and a third upper electrode UE3. The third lower electrode LE3 may be formed on substantially the same layer as that of the first upper electrode UE1 and be made of substantially the same material as that of the first upper electrode UE1. The third lower electrode LE3 may be spaced apart from the first upper electrode UE1 and may be electrically coupled to the second source electrode SE2 through the third contact hole CH3.

The third upper electrode UE3 may cover at least a portion of the third lower electrode LE3 in a plan view. The third upper electrode UE3 may be formed on substantially the same layer as that of the bridge pattern BRP and be made of substantially the same material as that of the bridge patter BRP. The third upper electrode UE3 may be provided as a part of the bridge pattern BRP or formed to have a shape protruding from the bridge pattern BRP.

Hereinafter, the configuration of the organic light emitting display device according to an exemplary embodiment of the invention will be described in a stacking sequence with reference to FIGS. 5 to 7.

The active pattern ACT may be provided on the substrate SUB. The active pattern ACT may include the first to third active patterns ACT1 to ACT3, the first to third drain electrodes DE1 to DE3, and the first to third source electrodes SE1 to SE3. The first to third active patterns ACT1 to ACT3, the first to third drain electrodes DE1 to DE3, and the first to third source electrodes SE1 to SE3 may include semiconductor material.

A buffer layer may be provided between the substrate SUB and the active pattern ACT.

A gate insulating layer GI may be provided on the substrate SUB on which the active pattern ACT has been formed.

The scan line Si and the first to third gate electrodes GE1 to GE3 may be provided on the gate insulating layer GI. The scan line Si and the first to third gate electrodes GE1 to GE3 may be formed of substantially the same material through substantially the same process. The first gate electrode GE1 may be a lower electrode LE of the storage capacitor Cst. The second gate electrode GE2 may be integrally formed with the scan line Si.

A first interlayer insulating layer IL1 may be provided on the substrate SUB on which the scan line Si has been formed.

The first upper electrode UE1 of the storage capacitor Cst, the control line CL, and the third lower electrode LE3 of the second capacitor C2 may be provided on the first interlayer insulating layer IL1. The first upper electrode UE1 of the storage capacitor Cst, the control line CL, and the third lower electrode LE3 of the second capacitor C2 may be formed of substantially the same material through substantially the same process.

The first upper electrode UE1 may cover the first lower electrode LE1. The first upper electrode UE1 and the first lower electrode LE1 may form the storage capacitor Cst, with the first interlayer insulating layer IL1 interposed between the first upper and lower electrodes UE1 and LE1.

The third lower electrode LE3 may be coupled to the second source electrode SE2 and the first gate electrode GE1 through the third contact hole CH3 that passes through the gate insulating layer GI and the first interlayer insulating layer IL. The third contact hole CH3 may also pass through the first gate electrode GE1.

The control line CL may be coupled to the third gate electrode GE3 through the sixth contact hole CH6 that passes through the first interlayer insulating layer IL1.

The second interlayer insulating layer IL2 may be provided on the substrate SUB on which the first upper electrode UE1 has been disposed.

The second lower electrode LE2, the third upper electrode UE3, the bridge pattern BRP, the initialization power line IPL, and the power line PL may be provided on the second interlayer insulating layer IL2. The second lower electrode LE2, the third upper electrode UE3, the bridge pattern BRP, the initialization power line IPL, and the power line PL may be formed of substantially the same material through substantially the same process.

The second lower electrode LE2 and the third upper electrode UE3 may be coupled to the bridge pattern BRP. The third upper electrode UE3 and the third lower electrode LE3 may form the second capacitor C2, with the second interlayer insulating layer IL2 interposed between the third upper and lower electrodes UE3 and LE3. The bridge pattern BRP may be coupled to the first source electrode SE1 and the third drain electrode DE3 through the second contact hole CH2 that passes through the gate insulating layer GI, the first interlayer insulating layer IL1, and the second interlayer insulating layer IL2. The initialization power line IPL may be coupled to the third source electrode SE3 through the fourth contact hole CH4 that passes through the gate insulating layer GI, the first interlayer insulating layer IL1, and the second interlayer insulating layer IL2, and may be coupled to the first upper electrode UE1 through the fifth contact hole CH5 that passes through the second interlayer insulating layer IL2. The power line PL may be coupled to the first drain electrode DE1 through the first contact hole CH1 that passes through the gate insulating layer GI, the first interlayer insulating layer IL1, and the second interlayer insulating layer IL2.

A third interlayer insulating layer IL3 may be provided on the substrate SUB on which the bridge pattern BRP has been disposed.

The data line Dm and the intermediate electrode ME may be provided on the third interlayer insulating layer 13. The data line Dm and the intermediate electrode ME may be formed of substantially the same material through substantially the same process. The intermediate electrode ME and the bridge pattern BRP may form the first sub-capacitor, with the third interlayer insulating layer IL3 interposed between the intermediate electrode ME and the bridge pattern BRP.

A protective layer PSV may be provided on the substrate SUB on which the data line Dm has been formed.

The second upper electrode UE2 and the organic light emitting diode OLED may be provided on the protective layer PSV. The organic light emitting diode OLED may include the first electrode AD, the second electrode CD, and the light emitting layer EML provided between the first electrode AD and the second electrode CD.

The second upper electrode UE2 and the first electrode AD may be provided on the protective layer PSV. The second upper electrode UE2 and the first electrode AD may be formed of substantially the same material through substantially the same process, and coupled to each other. The second upper electrode UE2 and the intermediate electrode ME may form the second sub-capacitor, with the protective layer PSV interposed between the second upper electrode UE2 and the intermediate electrode ME. The first electrode AD may be coupled to the bridge pattern BRP through the seventh contact hole CH7 that passes through the third interlayer insulating layer IL3 and the protective layer PSV. Because the bridge pattern BRP is coupled to the first source electrode SE1 through the second contact hole CH2, the first electrode AD may be electrically coupled to the first source electrode SE1.

A pixel defining layer PDL for defining an emission area corresponding to each pixel PXL may be provided on the substrate SUB on which the first electrode AD has been formed. The pixel defining layer PDL may expose an upper surface of the first electrode AD and may protrude from the substrate SUB along a perimeter of the pixel PXL.

The light emitting layer EML may be provided in the emission area surrounded by the pixel defining layer PDL. The second electrode CD may be provided on the light emitting layer EML. An encapsulation layer SLM covering the second electrode CD may be provided on the second electrode CD.

One of the first electrode AD and the second electrode CD may be an anode electrode, and the other one may be a cathode electrode. For example, the first electrode AD may be an anode electrode, and the second electrode CD may be a cathode electrode.

At least one of the first electrode AD and the second electrode CD may be a transmissive electrode. For example, in the case where the organic light emitting diode OLED is a bottom-emission type organic light emitting display device, the first electrode AD may be a transmissive electrode, and the second electrode CD may be a reflective electrode. In the case where the organic light emitting diode OLED is a top-emission type organic light emitting display device, the first electrode AD may be a reflective electrode, and the second electrode CD may be a transmissive electrode. In the case where the organic light emitting diode OLED is a double-side emission type organic light emitting display device, both the first electrode AD and the second electrode CD may be transmissive electrodes. In the illustrated embodiment, an example is shown in which the organic light emitting diode OLED is a top-emission type organic light emitting display element, and the first electrode AD is an anode electrode.

The first electrode AD may include a reflective layer which reflects light, and a transparent conductive layer which is disposed over or under the reflective layer. At least one of the transparent conductive layer and the reflective layer may be coupled to the bridge pattern BRP.

The reflective layer may include material that is capable of reflecting light. For example, the reflective layer may include at least one of aluminum Al, silver Ag, chrome Cr, molybdenum Mo, platinum Pt, nickel Ni and an alloy thereof.

The transparent conductive layer may include transparent conductive oxide. For example, the transparent conductive layer may include at least one of indium tin oxide ITO, indium zinc oxide IZO, aluminum zinc oxide AZO, gallium doped zinc oxide GZO, zinc tin oxide ZTO, gallium tin oxide GTO, and fluorine doped tin oxide FTO.

The pixel defining layer PDL may include organic insulating material. For example, the pixel defining layer PDL may include at least one of polystyrene, polymethylmethacrylate PMMA, polyacrylonitrile PAN, polyamide PA, polyimide PI, polyarylether PAE, heterocyclic polymer, parylene, epoxy, benzocyclobutene BCB, siloxane based resin, and silane based resin.

The light emitting layer EML may be disposed on the exposed surface of the first electrode AD. The light emitting layer EML may have a multilayer thin-film structure including at least a light generation layer LGL. For instance, the light emitting layer EML may include a hole injection layer HIL into which holes are injected, a hole transport layer HTL which has good hole transportation performance and restrains movement of electrons that have not been coupled with holes in the light generation layer and thus increases chances of recombination between holes and electrons, the light generation layer which emits light by recombination between injected electrons and holes, a hole blocking layer HBL which restrains movement of holes that have not been coupled with electrons in the light generation layer, an electron transport layer ETL which is provided to smoothly transport electrons to the light generation layer, and an electron injection layer EIL into which electrons are injected. The hole injection layer, the hole transport layer, the hole blocking layer, the electron transport layer, and the electron injection layer of the light emitting layer EML may be common layers which are disposed in common in the adjacent pixels PXL.

The color of light generated from the light generation layer may be one of red, green, blue and white, but it is not limited thereto. For example, the color of light generated from the light generation layer may be one of magenta, cyan and yellow.

The second electrode CD may be a semi-transmissive reflective layer. For example, the second electrode CD may be a thin metal layer having a thickness allowing light emitted from the light emitting layer EML to pass therethrough. The second electrode CD may allow some of the light generated from the light emitting layer EML to pass therethrough and may reflect the rest of the light generated from the light emitting layer EML.

The second electrode CD may include material having a work function lower than that of the transparent conductive layer. For instance, the second electrode CD may include at least one of molybdenum Mo, tungsten W, silver Ag, magnesium Mg, aluminum Al, platinum Pt, palladium Pd, gold Au, nickel Ni, neodymium Nd, iridium Ir, chrome Cr, lithium Li, calcium Ca, and an alloy thereof.

Some of the light emitted from the light emitting layer EML may not pass through the second electrode CD, and light reflected by the second electrode CD is reflected by the reflective layer again. In other words, light emitted form the light emitting layer EML may resonate between the reflective layer and the second electrode CD. The light extraction efficiency of the organic light emitting diode OLED may be enhanced by the resonance of light.

The distance between the reflective layer and the second electrode CD may change depending on the color of light emitted from the light emitting layer EML. In other words, depending on the color of light emitted from the light emitting layer EML, the distance between the reflective layer and the second electrode CD may be adjusted to correspond to a resonance distance.

The encapsulation layer SLM may prevent oxygen or water from permeating the organic light emitting diode OLED. The encapsulation layer SLM may include a plurality of inorganic layers and a plurality of organic layers. For example, the encapsulation layer SLM may include a plurality of unit encapsulation layers including an inorganic layer and an organic layer disposed on the inorganic layer. An inorganic layer may be disposed in an uppermost portion of the encapsulation layer SLM. The inorganic layer may include at least one of silicon oxide, silicon nitride, silicon oxynitride, aluminum oxide, titanium oxide, zirconium oxide, and tin oxide.

In accordance with the principles of the invention, only three transistors are included in the pixels of an organic light emitting display device, so that the pixels may be used in a high-resolution display panel. Furthermore, the voltage of a first driving power ELVDD during a programming period in which a data signal is stored in the pixel can be set to a value lower than during a light emitting period. Thus, deteriorating display quality of the display device can be prevented due to leakage current from the first driving power ELVDD. In an exemplary embodiment of the invention, a capacitor is formed between a gate electrode and a second electrode of a driving transistor. Accordingly, a variation in voltage of the gate electrode of the driving transistor depending on a change in voltage of a data line may be minimized.

Although certain exemplary embodiments and implementations have been described herein, other embodiments and modifications will be apparent from this description. Accordingly, the inventive concept is not limited to such embodiments, but rather to the broader scope of the appended claims and various obvious modifications and equivalent arrangements.

What is claimed is:
1. A pixel comprising:
an organic light emitting diode;
a first transistor configured to control, in response to a voltage of a first node, current flowing from a first driving power source to a second driving power source via the organic light emitting diode;
a second transistor coupled between the first node and a second electrode of the first transistor, and configured to be turned on when a scan signal is supplied to a scan line;
a storage capacitor coupled between an initialization power source and the first node;
a first capacitor coupled between the second electrode of the first transistor and a data line; and
a second capacitor coupled between the first node and the second electrode of the first transistor, the second capacitor having a higher capacitance than the capacitance of a channel capacitor disposed between a gate electrode of the first transistor and the second electrode.
2. The pixel of claim 1, further comprising a third transistor coupled between the initialization power source and the second electrode of the first transistor, and configured to be turned on when a control signal is supplied to a control line.

3. The pixel of claim 1, wherein the second transistor comprises a plurality of transistors coupled in series to one another.

4. An organic light emitting display device configured to be driven during frame periods, each of which is divided into an initialization period, a threshold voltage compensation period, a programming period, and a light emitting period, the organic light emitting display device comprising:
pixels disposed to be coupled with scan lines and data lines;
a scan driver configured to supply a scan signal to the scan lines;
a control driver configured to supply a control signal to a control line coupled in common with the pixels; and
a power supply configured to supply a first driving power, a second driving power, and an initialization power to the pixels,
wherein the first power driving power supplied from the power supply is set to different voltages during the threshold voltage compensation period, the programming period, and the light emitting period, and
wherein the power supply supplies the initialization power having a first voltage during the initialization period, the threshold voltage compensation period, and the programming period, and supplies the initialization power having a predetermined voltage higher than the first voltage during the light emitting period.

5. The organic light emitting display device of claim 4, wherein the first voltage is set such that an organic light emitting diode connected to one of the pixels is not emitted.

6. The organic light emitting display device of claim 4, wherein the power supply supplies the first driving power having a second voltage during the threshold voltage compensation period, supplies the first driving power having a third voltage higher than the second voltage during the programming period, and supplies the first driving power having a fourth voltage higher than the third voltage during the light emitting period.

7. The organic light emitting display device of claim 6, wherein the second voltage is lower than the first voltage.

8. The organic light emitting display device of claim 6, wherein the third voltage is set such that a driving transistor included in each of the pixels is turned off when a white data signal is supplied to the pixels.

9. The organic light emitting display device of claim 4, wherein each of the pixels disposed in an i-th (i is a natural number) horizontal line comprises:
an organic light emitting diode;
a first transistor configured to control, in response to a voltage of a first node, current flowing from the first driving power source to the second driving power source via the organic light emitting diode;
a second transistor coupled between the first node and a second electrode of the first transistor, and configured to be turned on when a scan signal is supplied to an i-th scan line;
a storage capacitor coupled between the initialization power source and the first node;
a first capacitor coupled between the second electrode of the first transistor and a data line;
a second capacitor coupled between the first node and the second electrode of the first transistor; and
a third transistor coupled between the initialization power source and the second electrode of the first transistor, and configured to be turned on when the control signal is supplied to the control line.

10. The organic light emitting display device of claim 9, wherein the second capacitor has a higher capacitance than the capacitance of a channel capacitor disposed between a gate electrode of the first transistor and the second electrode.

11. A method of driving an organic light emitting display device during frame periods, each of which is divided into an initialization period, a threshold voltage compensation period, a programming period, and a light emitting period, the method comprising the steps of:
coupling pixels with scan lines and data lines;
supplying a scan signal from a scan driver to the scan lines;
supplying a control signal from a control driver to a control line coupled in common with the pixels;
supplying a first driving power from a power supply to the pixels as different voltages during the threshold voltage compensation period, the programming period, and the light emitting period, and
supplying an initialization power having a first voltage during the initialization period, the threshold voltage compensation period and the programming period; and
supplying the initialization power having a predetermined voltage higher than the first voltage during the light emitting period.

12. The method of claim 11, wherein the step of supplying an initialization power having a first voltage during the initialization period, the threshold voltage compensation period and the programming period comprises supplying the first voltage at a level that does not cause an organic light emitting diode connected to one of the pixels to emit.

13. The method of claim 11, wherein the step of supplying a first driving power comprises supplying the first driving power having a second voltage during the threshold voltage compensation period, supplying the first driving power having a third voltage higher than the second voltage during the programming period, and supplying the first driving power having a fourth voltage higher than the third voltage during the light emitting period.

14. The method of claim 13, wherein the second voltage is lower than the first voltage.

15. The method of claim 13, wherein the third voltage is set such that a driving transistor included in each of the pixels is turned off when a white data signal is supplied to the pixels.

16. The method of claim 11, further comprising the step of supplying a second driving power from a power supply to the pixels.

* * * * *